United States Patent [19]
Arai et al.

[11] Patent Number: 5,703,486
[45] Date of Patent: Dec. 30, 1997

[54] BATTERY REMAINING CAPACITY MEASURING DEVICE

[75] Inventors: Youichi Arai, Shizuoka-ken, Japan; Brendan O'Toole, Co. Kerry, Ireland; Tsutomu Saigo, Shizuoka-ken, Japan; Kenichi Shimoyama, Shizuoka-ken, Japan; Ryo Kumagai, Shizuoka-ken, Japan; Yoshihide Takada, Shizuoka-ken, Japan

[73] Assignee: Yazaki Corporation, Tokyo, Japan

[21] Appl. No.: 517,272

[22] Filed: Aug. 21, 1995

[30] Foreign Application Priority Data

Aug. 25, 1994 [JP] Japan .................................. 6-200953

[51] Int. Cl.$^6$ .................................................. G01N 27/46
[52] U.S. Cl. ........................ 324/427; 324/430; 324/433; 320/43
[58] Field of Search ........................ 320/43, 48; 324/427, 324/428, 430, 433; 340/636

[56] References Cited

U.S. PATENT DOCUMENTS

| | | | |
|---|---|---|---|
| 4,390,841 | 6/1983 | Martin | 324/427 |
| 4,595,880 | 6/1986 | Patil | 324/427 |
| 5,539,318 | 7/1996 | Sasaki | 324/428 |
| 5,545,969 | 8/1996 | Hasegawa | 324/427 |
| 5,592,094 | 1/1997 | Ichikawa | 324/427 |

FOREIGN PATENT DOCUMENTS

| | | |
|---|---|---|
| 5-173913 | 7/1993 | Japan . |
| 6-34727 | 2/1994 | Japan . |

*Primary Examiner*—Vinh P. Nguyen
*Assistant Examiner*—Jose M. Solis
*Attorney, Agent, or Firm*—Finnegan, Henderson, Farabow, Garrett & Dunner, L.L.P.

[57] ABSTRACT

A voltage sensor detects a terminal voltage of a battery connected to a load and a current sensor detects a current flowing through the load. A voltage-current changing tendency calculation unit reads a detected voltage and a detected current detected by the voltage sensor and the current sensor and outputs, every predetermined period of time, plural data of the detected voltage and the corresponding detected current as dispersed data. A voltage-current approximating line calculation unit inputs the dispersed data and determines, based on the dispersed data, a voltage-current approximating linear function each time the predetermined period of time. A battery remaining capacity calculation unit determines, each time the voltage-current approximating linear function is determined, a remaining capacity of the battery based on the voltage-current approximating linear function. Particularly the voltage-current approximating line calculation unit determines the voltage-current approximating linear function by applying a method of least squares to the plural data of the voltage and the corresponding current of the dispersed data.

3 Claims, 15 Drawing Sheets

FIG.8

DATA TABLE

| BATTERY TEMPERATURE \ VOLTAGE | 19.0 (V) | 22.7 | 25.2 (V) |
|---|---|---|---|
| −20 (°C) | 0 | 24 | 99 |
| ... | 0 | 15 | 94 |
| 60 (°C) | 0 | 14 | 85 |

REMAINING CAPACITY RATIO (%)

BATTERY REMAINING CAPACITY MEASURING DEVICE

BACKGROUND OF THE INVENTION

1. Field of the Invention

The present invention relates to a battery remaining capacity measuring device, and more specifically, to a battery remaining capacity measuring device capable of accurately determining and displaying a battery remaining capacity even if a load abruptly varies.

2. Description of the Prior Art

In general, batteries have discharge characteristics which are different depending upon the variation of a load connected to the batteries, an environmental temperature, aged deterioration and the like. Therefore, a remaining capacity of batteries is also different depending upon variation of a load, an environmental temperature, aged deterioration and the like.

For example, as shown in FIG. 1, even if a temperature is kept at a constant value of 20° C., a battery has different discharge characteristics depending upon whether a current discharged from the battery is 10 A, 20 A, ... or 80 A. When it is assumed that a usable voltage range is from 25V to 20V, the battery becomes unusable when it is operated for 160 minutes with a discharge current of 10 A and when it is operated for 40 minutes with a discharge current of 30 A. That is, batteries have a different discharge ratio and thus a different remaining capacity depending upon variation of a load.

In particular, since electromobiles are powered by a battery, a remaining capacity of the battery must be accurately predicted. The following methods are available to measure a remaining capacity of a battery:

(1) a method of predicting a remaining capacity by measuring and integrating an electric energy actually supplied from a battery to a load and predicting a remaining capacity from the value of the integrated electric energy and an electric energy when the battery is charged;

(2) a method of predicting a remaining capacity by measuring a terminal voltage when a discharge current flows from the terminal of a battery to a load;

(3) a method of predicting a remaining capacity by measuring a specific gravity of battery electrolyte in a battery;

(4) a method of predicting a remaining capacity by measuring a terminal voltage in an open circuit state achieved by releasing a battery from a load, and the like.

However, the method of the item (4) cannot be applied to such a system as an electromobile and the like because a remaining capacity must be measured by electrically separating a load from a battery. Further, although the method of the item (3) utilizes a phenomenon that a specific gravity of battery electrolyte is reduced by discharge, this method is unsuitable for the electromobile because an electrolytic vessel must be modified to accommodate a specific gravity sensor in the battery.

Thus, in general, the method of the above item (1) or (2) is mainly applied to the electromobile. A battery remaining capacity meter employing the above method, which is disclosed in Japanese Patent Laid-Open No. 6-34727, will be described as an example.

As shown in this official gazette, when a switch is turned on and a voltmeter and an ammeter show that a voltage and current from a main battery are equal to or greater than predetermined values, a conventional battery remaining capacity meter fetches the current and voltage at the time together with data detected by a temperature sensor to a V-I characteristics calculation means and determines V-I characteristics.

There is a good correlation between the V-I characteristics determined in the above state and a remaining capacity of the battery. Thus, the relationship between them is prestored and a remaining capacity calculation means determines a remaining capacity of the main battery from a relationship between actually determined V-I characteristics and the stored relationship therebetween and displays the remaining capacity on a display unit.

However, a degree of change of a voltage and current does not always have a correlation. When the waveforms of a voltage and a current of FIGS. 2A and 2B are compared, for example, there is a portion where a correlation between the voltage and current is not established as shown in P in FIG. 2C.

It is contemplated that this is caused by a terminal voltage of the battery which does not follow an abrupt change of a current discharged from the battery.

Therefore, when a load abruptly changes, a degree of change of a current and voltage does not correlate with each other.

However, since a remaining capacity of a main battery is determined from actually determined V-I characteristics and a prestored relationship between V-I characteristics and a remaining capacity of the battery on the assumption that there is a good correlation between the V-I characteristics and the remaining capacity, a problem arises in that when a load abruptly varies, a remaining capacity of the battery cannot be accurately determined.

Consequently, there is a problem that a remaining capacity of a battery which is displayed when a load abruptly varies is not reliable.

SUMMARY OF THE INVENTION

The present invention was made to solve the above problems and is directed to provide a battery remaining capacity measuring device capable of accurately measuring a remaining capacity of a battery even if a load abruptly varies.

The present invention provides a battery remaining capacity measuring device comprising voltage detecting means for detecting a terminal voltage of a battery connected to a load; current detecting means for detecting a current flowing through the load; voltage-current changing tendency calculation means for reading a detected voltage and a detected current detected by said voltage detecting means and said current detecting means and outputting, every predetermined period of time, plural data of the detected voltage and the corresponding detected current as dispersed data; voltage-current approximating line calculation means for inputting the dispersed data and determining, based on the dispersed data, a voltage-current approximating linear function each time the predetermined period of time; and battery remaining capacity calculation means for determining, each time the voltage-current approximating linear function is determined, a remaining capacity of the battery based on the voltage-current approximating linear function.

In one preferred embodiment, the voltage-current changing tendency calculation means averages data of a detected voltage and a detected current detected by said voltage detecting means and said current detecting means during a second predetermined period of time and outputs a group of the averaged data determined every second predetermined period of time during said predetermined period of time as the dispersed data.

In another preferred embodiment, said voltage-current approximating line calculation means determines the voltage-current approximating linear function by applying a method of least squares to the plural data of the voltage and the corresponding current of the dispersed data.

In still another preferred embodiment, said battery remaining capacity calculation means calculates a voltage value corresponding to a given discharge current according to the voltage-current approximating linear function and estimates the voltage value as the remaining capacity of the battery.

In further preferred embodiment, it further comprises temperature detecting means for detecting a temperature of the battery and said battery remaining capacity calculation means calculates a voltage value corresponding to a given discharge current according to the voltage-current approximating linear function and determines the remaining capacity based on the voltage value, a temperature data detected by the temperature detecting means, and a prestored voltage-temperature-remaining capacity data table or function when the predetermined current is discharged.

In still further preferred embodiment, when the variation of the load is equal to or less than a predetermined amount, said battery remaining capacity calculation means determines the remaining capacity by directly inputting the detected voltage and the detected current from the voltage detecting means and the current detecting means.

In still further preferred embodiment, it further comprises determination means for determining a correlation coefficient between detected voltages and currents from the dispersed data, determining that the variation of the load is equal to or less than a predetermined amount when the correlation coefficient exhibits a negative correlation and is equal to or greater than a second reference negative correlation coefficient, and determining that the variation of the load is greater than the predetermined amount when the correlation coefficient is equal to or less than a first reference negative correlation coefficient which is less than the second reference negative correlation coefficient.

In still further preferred embodiment, when the correlation coefficient is located between the first reference negative correlation coefficient and the second reference negative correlation coefficient, said determination means determines that the remaining capacity of the battery drops below a predetermined amount.

Concretely, according to the present invention, the voltage sensor detects a terminal voltage of the battery connected to a load and the current sensor detects a current flowing through the load.

Each time a predetermined time elapses, the voltage-current changing tendency calculation unit reads the detected voltage and current and each time the predetermined number of the detected voltages and currents are collected, they are produced as dispersed data.

The voltage-current approximating line calculation unit reads the dispersed data for the collecting period and determines a voltage-current approximating linear function for the period during which the predetermined number of detected voltages and currents are collected. That is, as a load varies more abruptly, a voltage-current approximating linear function having a higher degree of correlation can be obtained.

Each time the voltage-current approximating linear function is determined, the battery remaining capacity calculation unit determines a remaining capacity based on voltage-current characteristics obtained from the voltage-current approximating linear function.

Each time a predetermined time elapses, the voltage-current changing tendency calculation unit samples a detected voltage and current, and each time the sampled voltages and currents amount to a predetermined number, respectively, the voltage-current changing tendency calculation unit averages them. Then, each time the averaged detected voltages and currents amount to a predetermined number, they are produced as dispersed data.

Each time the dispersed data is produced, the voltage-current characteristics calculation unit determines an approximating line in which the errors of a plurality of voltages and currents are minimized by a method of least squares so as to determine a voltage-current approximating linear function in accordance with a remaining capacity of the battery.

Each time the voltage-current approximating linear function is determined, the battery remaining capacity calculation unit calculates a voltage value corresponding to a given discharge current predetermined from the voltage-current approximating linear function and the voltage value is displayed as a remaining capacity.

Each time the voltage-current approximating linear function is determined, the battery remaining capacity calculation unit determines a remaining capacity based on voltage-current characteristics obtained from the voltage-current approximating line and a data table or a function indicating a remaining capacity to prestored voltage-current characteristic.

When the sensing unit includes the temperature sensor for detecting a temperature of the battery in addition to the voltage sensor and current sensor, each time the voltage-current approximating linear function is determined, the battery remaining capacity calculation unit calculates a voltage value corresponding to the given discharge current predetermined from the voltage-current approximating linear function and the remaining capacity is determined based on the voltage value, a temperature of the temperature sensor and a voltage-temperature-remaining capacity data table or function obtained at the predetermined given discharge.

When the vibration of the load is equal to or less than the predetermined amount, the voltage-current approximating line calculation unit is stopped by the battery remaining capacity calculation unit and the remaining capacity is determined based on a voltage and current detected from the voltage sensor and current sensor.

The determination unit determines the correlation coefficient between detected voltages and currents based on the dispersed data determined by the voltage-current changing tendency calculation unit. When the correlation coefficient exhibits a negative correlation as well as a negative correlation weaker than the second reference negative correlation coefficient, the determination unit determines that the variation of the load is equal to or less than a predetermined amount, and when the correlation coefficient is equal to or greater than the first reference negative correlation coefficient (first reference negative correlation coefficient<second reference negative correlation coefficient), the determination unit determines that the variation of the load is greater than the predetermined amount.

When the variation of the load is less than the predetermined amount, the battery remaining capacity calculation unit stops the voltage-current approximating line calculation unit and the remaining capacity is determined based on a voltage detected from the voltage sensor and a current detected from the current sensor.

Further, it is determined by the determination unit that the correlation coefficient between the detected voltages and current is located between the first and second reference negative correlation coefficients, it is displayed on the display unit that the remaining capacity drops below the predetermined value.

BRIEF DESCRIPTION OF THE DRAWINGS

In the accompanying drawings:

FIG. 8 is a table for use in describing a relationship among a temperature, voltage, and remaining capacity stored in a memory 42;

DESCRIPTION OF PREFERRED EMBODIMENTS

The following embodiments are for describing examples in which a battery remaining capacity measuring device of the present invention is used to measure a remaining capacity of a battery mounted on an electromobile.

Embodiment 1

Figure 3:
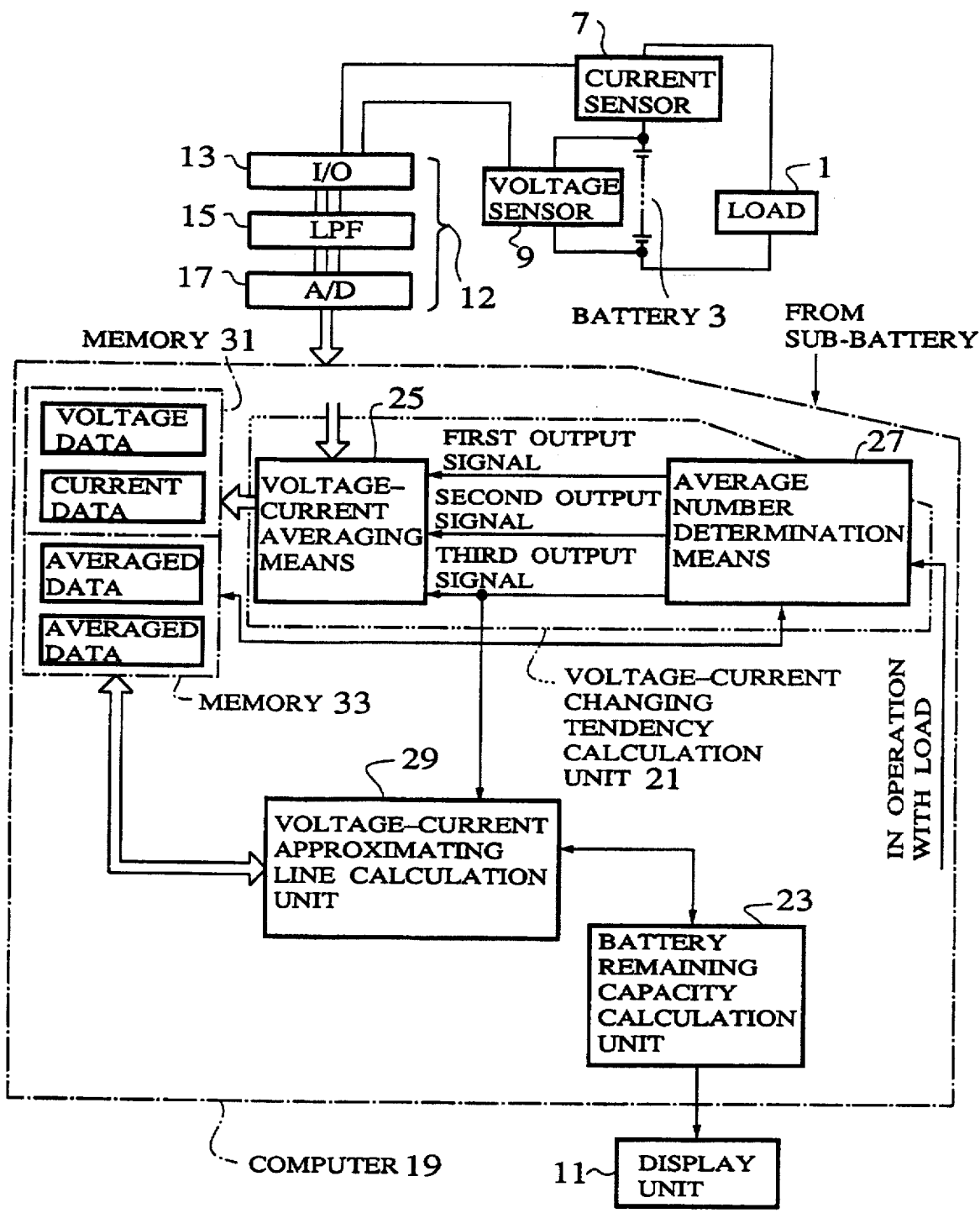
FIG. 3 is a block diagram schematically showing the arrangement of the embodiment 1.

FIG. 3 is a block diagram schematically showing the arrangement of an embodiment 1. Reference numeral 11 denotes a detected value input circuit unit. The detected value input circuit unit 12, which is composed of an I/O unit 13, a low-pass-filter 15, and an A/D converter 17, receives a current discharged from a battery 3 and a terminal voltage of the battery from a current sensor 7 and a voltage sensor 9 as a detected voltage and current and converts them into digital values after removing noise therefrom.

A reference numeral 19 denotes a computer. The computer 19 has a program arrangement comprises a voltage-current changing tendency calculation unit 21, a battery remaining capacity calculation unit 23, a voltage-current approximating line calculation unit 29 and is put into operation by power from a sub-battery when an ignition key is turned on.

The voltage-current changing tendency calculation unit 21 is composed of an average number determination means 27 and a voltage-current averaging means 25.

Each time a digital current and voltage detected from the battery 3 are received from the detected value input circuit unit 12 and a first output signal is produced from the average number determination means 27, the voltage-current averaging means 25 samples the detected current and voltage and adds the sampled values to previous values, respectively each time the sampling is carried out and stores them in a memory 31 as total voltage data and total current data, respectively. Further, each time a second output signal is produced from the average number determination means 27, the voltage-current averaging means 25 averages the total voltage data and total current data stored in the memory 31 based on the number of additions, respectively and the resultant averaged values are independently stored in a memory 33, respectively each time the data is averaged. Further, each time a third output signal is produced, the voltage-current averaging means 25 clears the values stored in the memories 31 and 33.

The average number determination means 27 produces the first output signal to the voltage-current averaging means 25 each 100 milliseconds while a load operation signal indicating that an electromobile is in operation is produced and further produces the second output signal to the voltage-current averaging means 25 each time the number of addition of detected currents and voltages amounts to 100 (each time 10 seconds elapse). Further, the average number determination means 27 produces the third output signal to the voltage-current averaging means 25 and the voltage-current approximating line calculation unit 29 when each 100 pieces of average current values and average voltage values are stored in the memory 33, that is, when about 16 minutes elapse.

More specifically, the voltage-current averaging means 25 and the average number determination means 27 obtain dispersed data of discharge currents and voltages from the battery 3 in each predetermined period of time.

Each time 16 minutes elapse and the third output signal is produced, the voltage-current approximating line calculation unit 29 reads a plurality of average voltage values and average current values from the memory 33, determines the total sum of square of errors of both values and further determines a, b to minimize the errors and then determines a voltage-current approximating linear function (Y=aX+b) for the 16 minutes.

Each time the voltage-current approximating line calculation unit 29 determines the voltage-current approximating linear function, the battery remaining capacity calculation unit 23 specifies a voltage value X on a voltage axis-current axis from a predetermined discharge current value Y based on the linear expression (Y=aX+b) and displays the voltage value X on a display unit 11.

Figure 4:
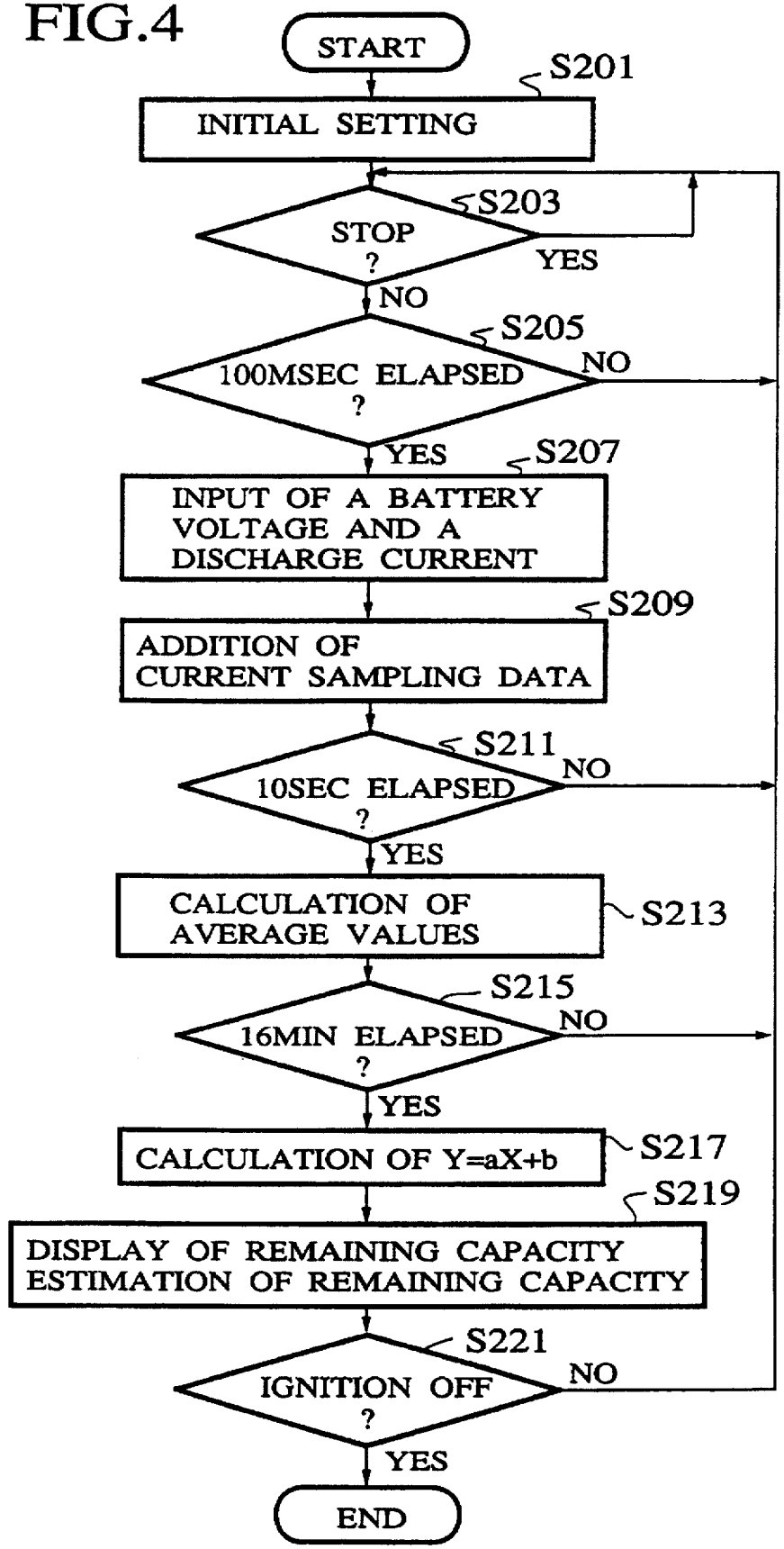
FIG. 4 is a flowchart for use in describing operation of the embodiment 1.

Operation of the battery remaining capacity measuring device arranged as described above will be described below. FIG. 4 is a flowchart for use in describing operation of the embodiment 1.

First, when power is supplied from the sub-battery to the computer by the turning on of the ignition key, the computer checks the respective units and carried out initial setting such as storing a program in a ROM to a RAM, and the like (step S201). Then, the average number determination means 27 determines whether the electromobile stops or not based on the load operation signal (step S203).

The load operation signal is produced when, for example, an amount of operation of an accelerator, an amount of a speed pulse, an amount of rotation of a wiper, or the like is equal to or greater than a predetermined value or the compressor or the like of an air conditioner carries out switching operation. When the load operation signal is produced, the average number determination means 27 determines that the electromobile is in operation, whereas when the load operation signal is not produced, the means 27 determines that the electromobile stops.

Further, it is also possible to determine whether the electromobile is in operation or stops based on a correlation and then to produce the load operation signal. This example will be described in an embodiment 4 to be described later.

Next, when the electromobile does not stop, i.e. when it is determined to be in operation, the average number determination means 27 determines whether 100 milliseconds have elapsed or not (step S205), and when 100 milliseconds have elapsed, the average number determination means 27 produces the first output signal to the voltage-current averaging means 25. Then, the voltage-current averaging means 25 reads a battery voltage (VOLT) and a discharge current (CURR) from the detected value input circuit unit 12 (step S207), adds sampling data (discharge current and voltage) when 100 milliseconds elapse to previous values, respectively and stores them to the memory 31 as a total sum value of voltage data and a total sum value of current data, and the average number determination means 27 counts the number of addition (step S209).

Next, the average number determination means 27 determines whether a count value N amounts to 100 or not, that is, whether 10 seconds have elapsed or not (step S211), and when 10 seconds have not elapsed, the control is moved to step S203 where the average number determination means 27 causes the voltage-current averaging means 25 to add a discharged current and voltage each 100 milliseconds as described above and counts the number of addition.

Next, when 10 seconds have elapsed, that is, when the detected currents and voltage s are added 100 times, the average number determination means 27 produces the second output signal to the voltage-current averaging means 25, averages each 100 pieces of the detected currents (total sum of current data) and the detected voltages (total sum of voltage data), respectively and stores them in the memory 33 (step S213). Then, it is determined whether the numbers of average values amounted to 100 pieces at step S213, respectively, or not, that is, about 16 minutes have elapsed or not (step S215). When about 16 minutes have not yet elapsed, the control is moved to step S203 where each 100 pieces of detected currents and voltages are added are added during 10 seconds as described above and 100 pieces of average values are determined based on the number of addition.

Figure 1:
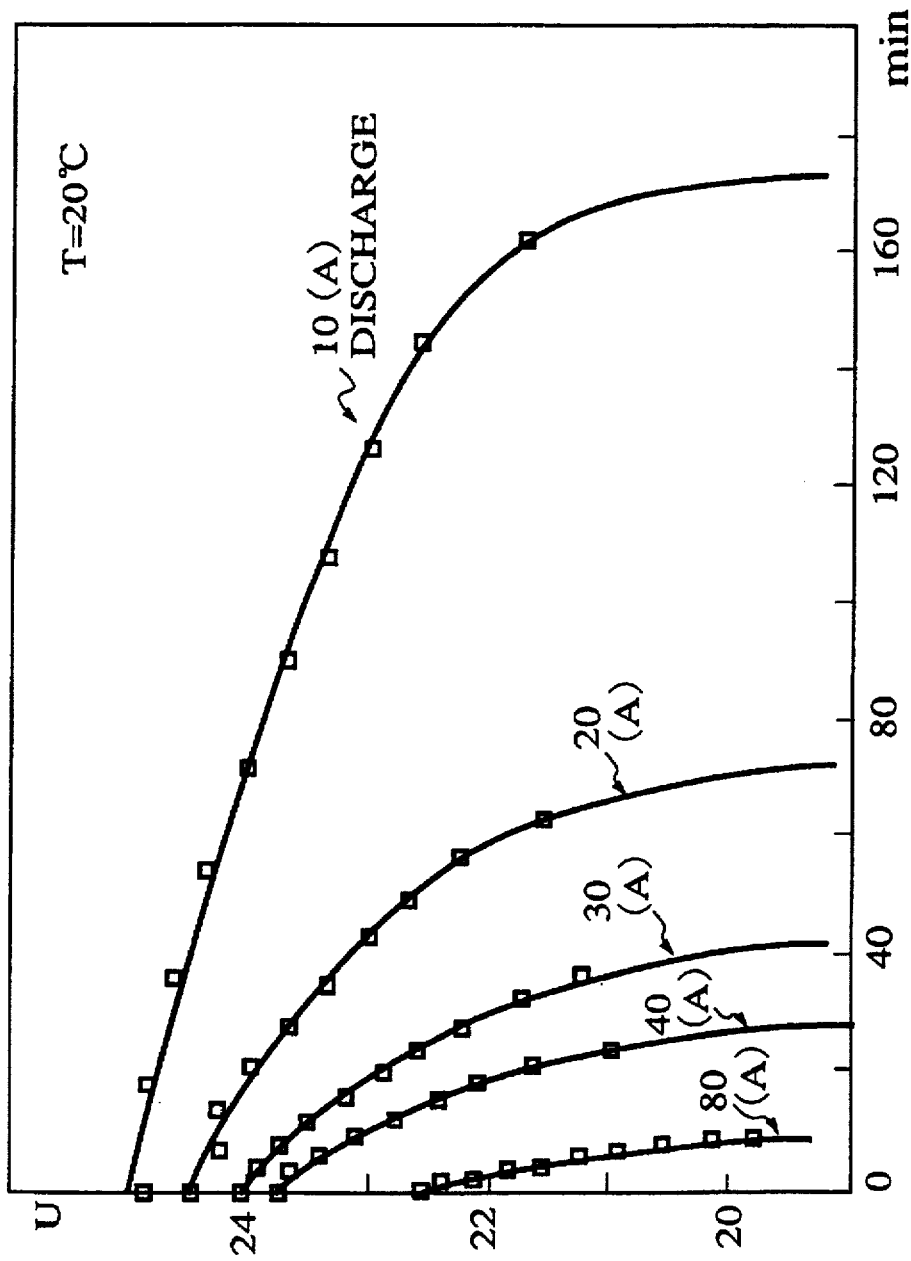
FIG. 1 is a graph for use in describing discharge characteristics of a battery.
Figure 2A:
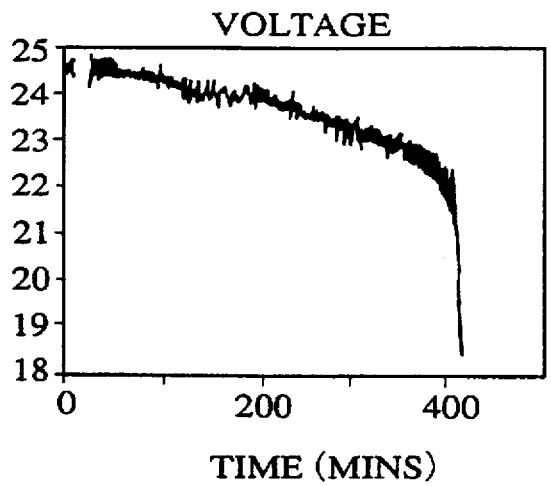
FIGS. 2A-2C are graphs showing a state that there is no correlation between a voltage and current.
Figure 2B:
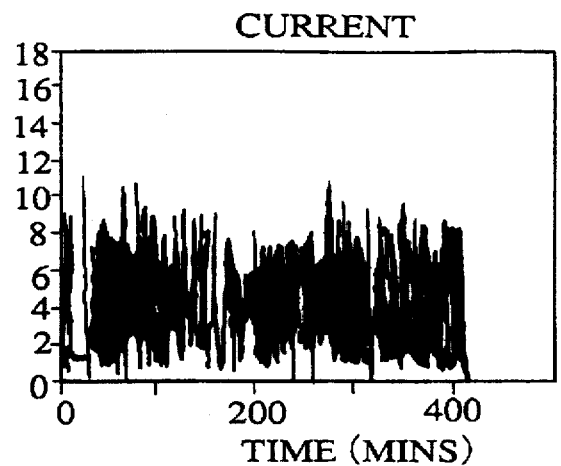
Figure 2C:
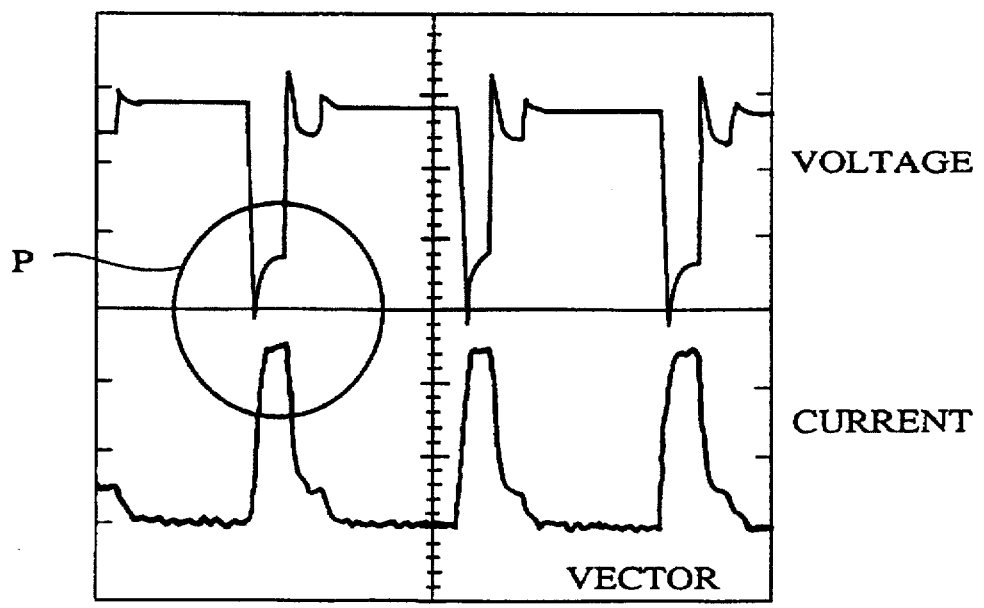
Figure 5:
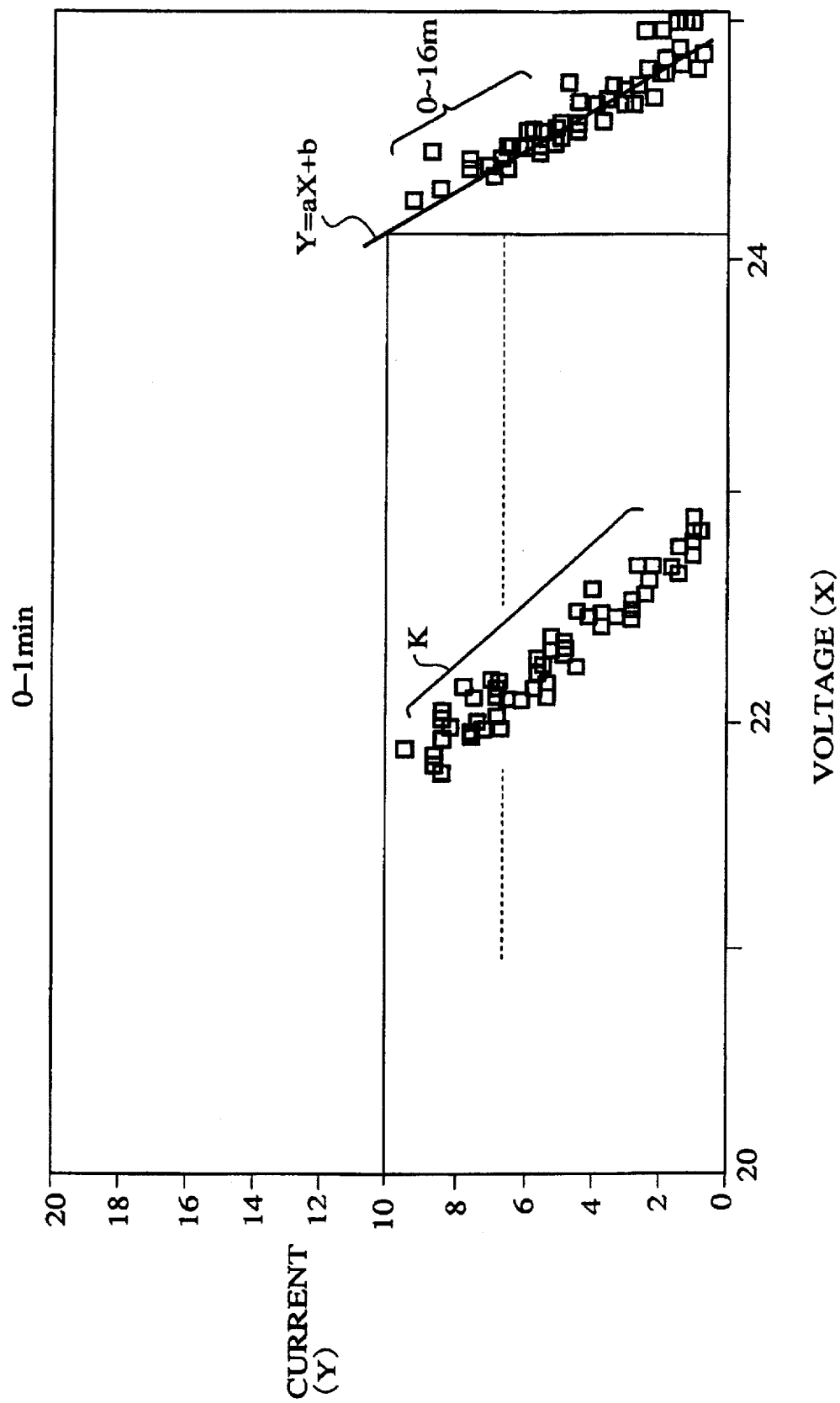
FIG. 5 is a graph for use in describing a tendency of V-I characteristics of a battery.

Therefore, the voltage-current averaging means 25 and the average number determination means 27 obtain dispersed data of a plurality of voltages and currents in a plurality of discharge characteristics in accordance with the variation of a load as shown in FIG. 1 during 16 minutes on the voltage and current axes as shown in FIG. 5.

Further, as shown in FIG. 5, a current and voltage of the battery 3 have characteristics that the voltage drops as a time elapses, from which the following processing is carried out using the voltage-current approximating line calculation unit 29.

When the average number determination means 27 determines at step S215 that about 16 minutes have elapsed, the average number determination means 27 produces the third output signal to the voltage-current averaging means 25 and the voltage-current approximating line calculation unit 29. The voltage-current approximating line calculation unit 29 reads each 100 pieces of average voltage vales and average current values from the memory 33 and determines $\bar{a}$ and $\bar{b}$ of a linear expression (Y=aX+b) by obtaining the total sums of squares of the errors of the both values (method of least squares).

Then, the battery remaining capacity calculation unit 23 specifies a voltage value from the linear expression (Y=aX+b) and a predetermined discharge current value (step S217).

As shown in FIG. 5, this means that a voltage of the voltage-current approximating linear function corresponding a discharge current value Y on the voltage and current axes is specified.

When a discharge current at the time is assumed to be 10 A, a voltage shown in FIG. 5 has a voltage value slightly higher than 24V when it is determined based on the linear expression (Y=aX+b).

Figure 6:
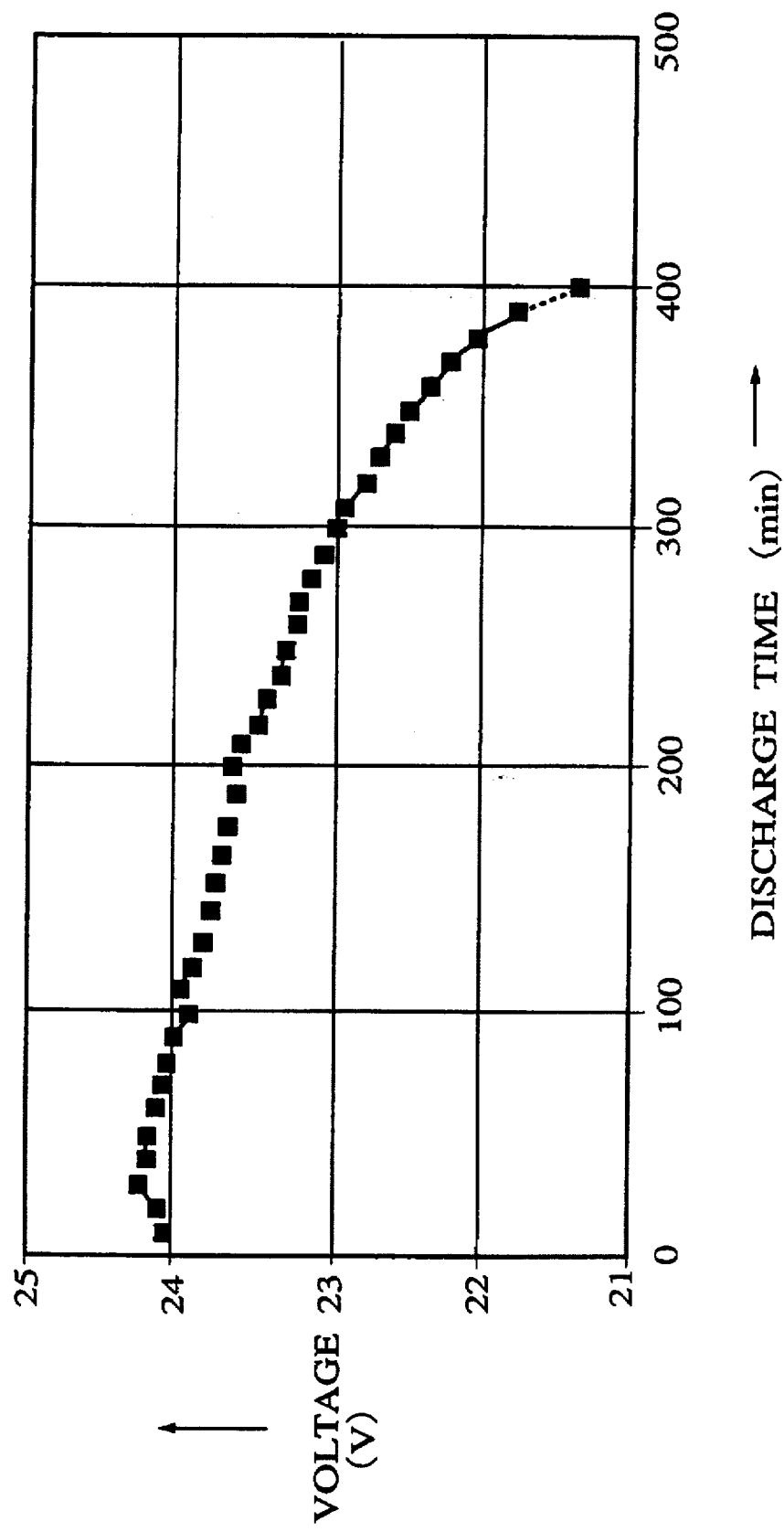
FIG. 6 is a graph for use in describing a tendency of a terminal voltage of a battery.

FIG. 6 shows the relation between each discharge time and the voltage value specified from (Y=aX+b) at each discharge time when the discharge current is 10 (A).

A method of determining an approximating line will be described. It is assumed here that S represents, for example, a total sum of squares of errors of both currents and voltages.

Method of determining the coefficients of the linear expression Y=aX+b by method of least squares:

S is expressed by the equation (1).

$$S = E\{Y_i - (aX_i + b)\}^2 \quad (1)$$

When S is made differentiated by $\bar{a}$ and $\bar{b}$ and equaled to 0, the following expressions are obtained.

$$\theta S/\theta b = 2 \sum_{i=1}^{n} b + 2 \sum_{i=1}^{n} Xi\, a - 2 \sum_{i=1}^{n} Yi = 0 \quad (2)$$

$$\theta S/\theta a = 2 \sum_{i=1}^{n} Xi\, b + 2 \sum_{i=1}^{n} Xi^2 a - 2 \sum_{i=1}^{n} Xi\, Yi = 0$$

When the above both expressions are simultaneously solved, the following expressions are obtained.

$$a = \frac{\sum_{i=1}^{n} Xi\, Yi - \left(\sum_{i=1}^{n} Xi \sum_{i=1}^{n} Yi\right)/n}{\sum_{i=1}^{n} Xi^2 - \left(\sum_{i=1}^{n} Xi\right)^2/n} \quad (3)$$

$$b = \sum_{i=1}^{n} Yi/n - \sum_{i=1}^{n} Xi(a/n) \quad (4)$$

As a result, a value of X (voltage) is obtained at a time when Y (current)=an optional value from the following expression (5).

$$X = (Y - b)/a \quad (5)$$

Next, each time a specified voltage value is determined, the battery remaining capacity calculation unit 23 displays the specified voltage value on a display unit 35 (S219).

Whether the control is finished or not, that is, whether the ignition key is turned off or not is determined. When the control is not finished, it is moved to step S208 wherein when the electromobile is in operation, each time dispersed data of voltages and currents is determined within a predetermined period of time, a V-I approximating line by which the errors of both currents and voltages are minimized is determined from the data in the same way as the above, and a voltage is specified and displayed based on the V-I approximating line and the predetermined reference discharge current value.

Therefore, since each V-I approximating line determined while the electromobile is in operation is an approximating linear function which sufficiently takes the variation of a voltage and current into consideration, a voltage value specified each time the V-I approximating line is determined is a value representing a terminal voltage in the predetermined reference discharged current.

Further, when a load is abruptly varies and a ratio of a voltage and current changes in a wide range, since the greater number of dispersed data can be obtained, a tendency of the change can be vividly captured.

Embodiment 2

In general, V-I characteristics of batteries may abruptly change depending upon a temperature. Since a voltage value in the embodiment 1 is a value including a temperature change by itself, when the electromobile is operated for a long time, a remaining capacity can be supposed by displaying a voltage. However, an embodiment 2 is arranged to display a remaining capacity of a battery by taking a temperature change into consideration to make the remaining capacity more comprehensible.

Figure 7:
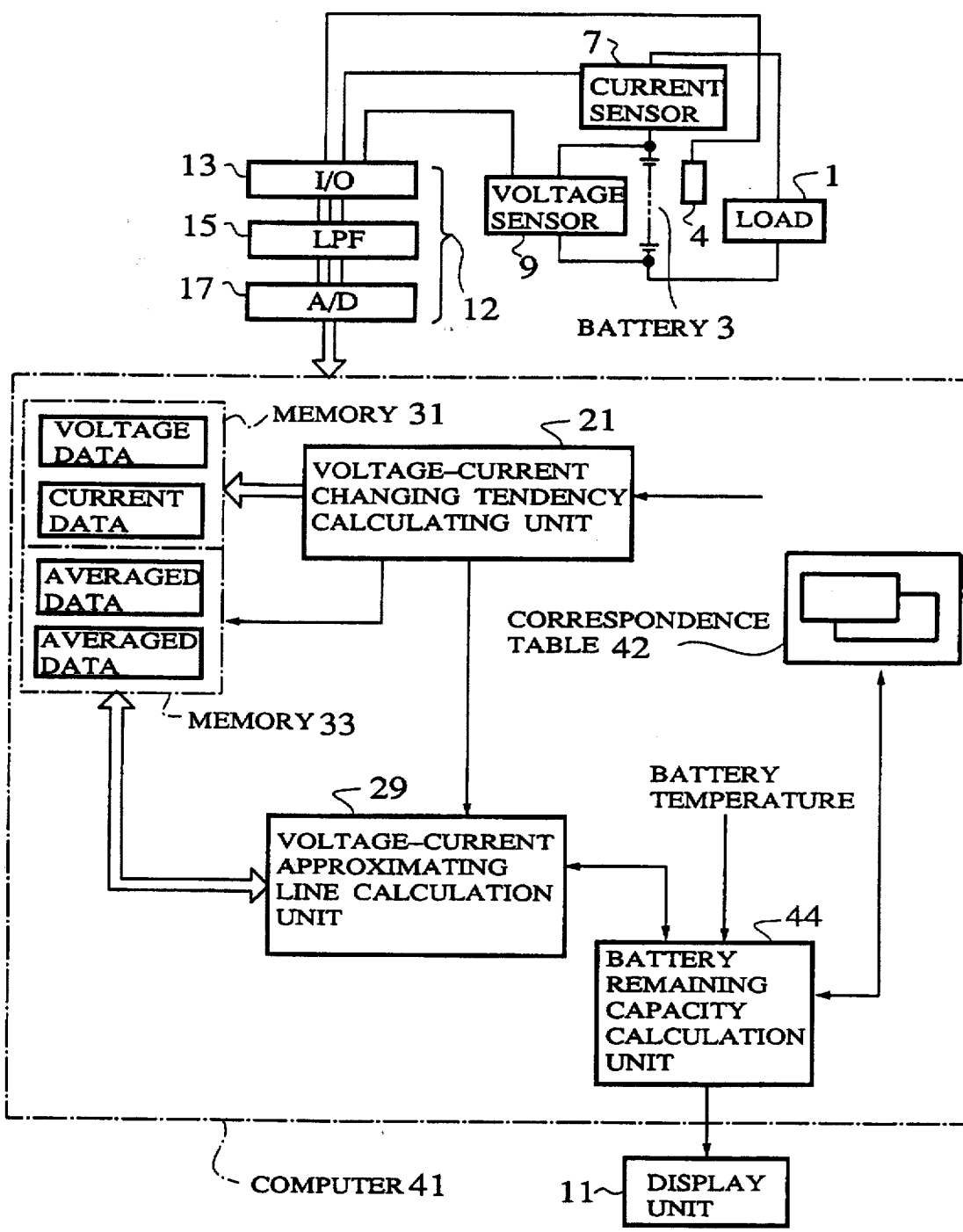
FIG. 7 is a block diagram schematically showing the arrangement of the embodiment 2.

FIG. 7 is a block diagram schematically showing the arrangement of the embodiment 2. In FIG. 7, a reference numeral 1 to 33 denote the same components as those shown in FIG. 3. A reference numeral 4 denotes a temperature sensor provided with a battery 3 for detecting a temperature.

A computer 41 has a program arrangement composed of a voltage-current changing tendency calculation unit 21 and a battery remaining capacity calculation unit 44 similarly to those of the embodiment 1.

When a terminal voltage of the battery 3 is specified based on an approximating linear function of a voltage-current approximating line calculation unit 29, the battery remaining capacity calculation unit 44 reads a temperature of the battery 3 detected by the temperature sensor 4 and then reads a remaining capacity corresponding to the temperature and the specified voltage from a memory 42 and produces the remaining capacity corresponding to the temperature and specified voltage on a display unit 11.

As shown in FIG. 8, the memory 42 stores remaining capacities corresponding to temperatures of the battery 3 and terminal voltages thereof. Although the corresponding table shown in FIG. 8 is arranged as a table, the table may be stored as a function representing remaining capacities corresponding to temperatures of the battery 3 and terminal voltages thereof.

Figure 9:
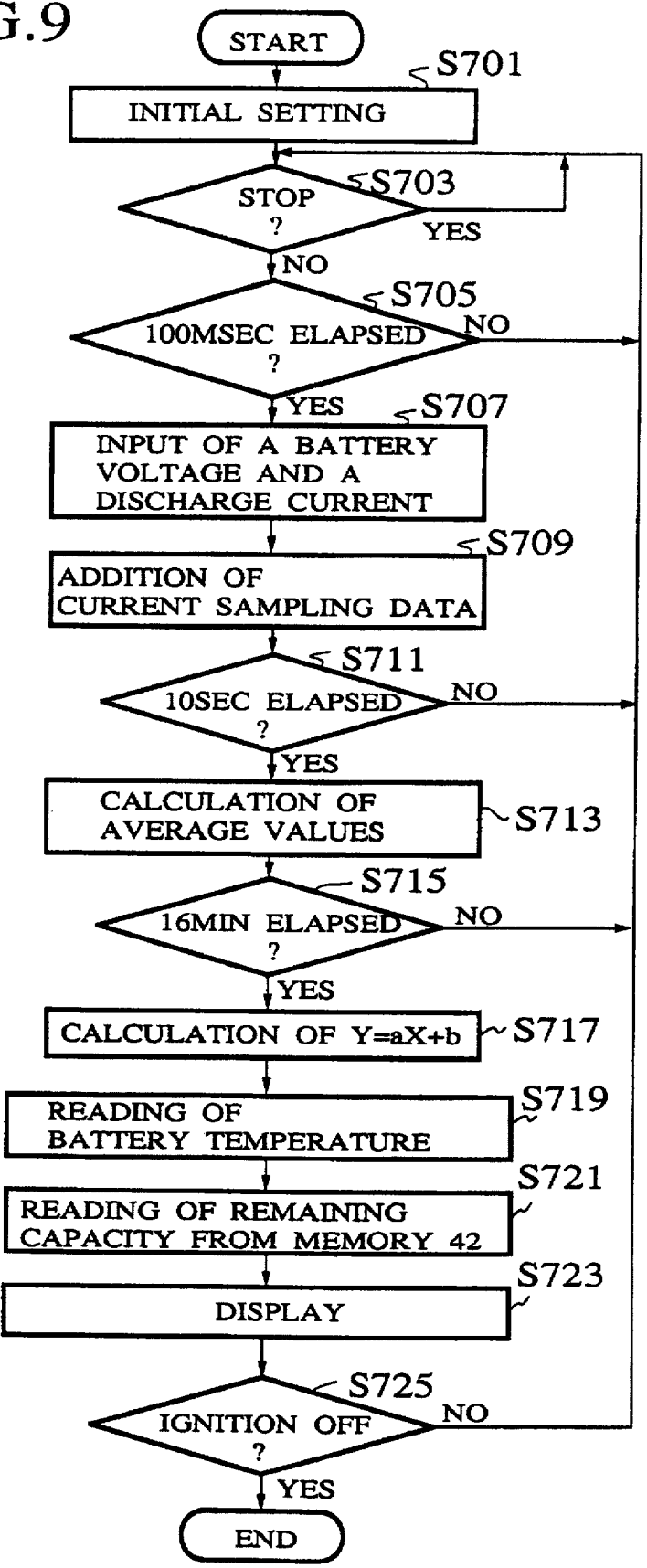
FIG. 9 is a flowchart for use in describing operation of the embodiment 2.

Operation of a battery remaining capacity measuring device of the embodiment 2 arranged as described above will be described below. FIG. 9 is a flowchart showing the operation of the embodiment 2.

As shown in FIG. 9, processings carried out at steps S701 to S717 are similar to those carried out at steps S201 to S217 of FIG. 4. That is, the voltage-current averaging means 25, the average number determination means 27 and the voltage-current approximating line calculation unit 29 of the voltage-current changing tendency calculation unit 21 read a terminal voltage of the battery 3 from a voltage sensor 9 and a current flowing through a load from a current sensor 7, respectively each 100 milliseconds similarly to the above; add the read voltages and currents and averages them until 10 seconds elapse; obtain 100 pieces of the averaged voltages and currents to thereby obtain dispersed data of the voltages and currents; determine a voltage-current approximating linear function based on the dispersed data; and specify a terminal voltage X of the battery 3 by the voltage-current approximating linear function and a reference discharge current (steps S701–S717).

Then, when the specific voltage X is received, the battery remaining capacity calculation unit 44 reads a battery temperature from the temperature sensor 4 through a detected value input circuit unit 12 (step S719) and the reads a remaining capacity corresponding to the specified voltage X and the battery temperature from the memory 42 (step S721) and displays the remaining capacity on the display unit 11 (S723).

Next, whether the control is finished or not is determined (step S725) and when it is not finished, the control is moved to step S703 and processings similar to the above are carried out.

Consequently, since the battery remaining capacity calculation unit 44 displays a ratio of a remaining capacity corresponding to a temperature and voltage in the memory 42 as a remaining capacity depending upon a specified voltage obtained from the approximating linear function, the device can be simply arranged and made at a low cost as well as displays a remaining capacity with a high accuracy.

Further, since a remaining capacity is based on a temperature and voltage, a driver need not suppose a remaining capacity based on a displayed voltage value. Thus, even a driver driving an electromobile for the first time can get an accurate remaining capacity.

Embodiment 3

Figure 10:
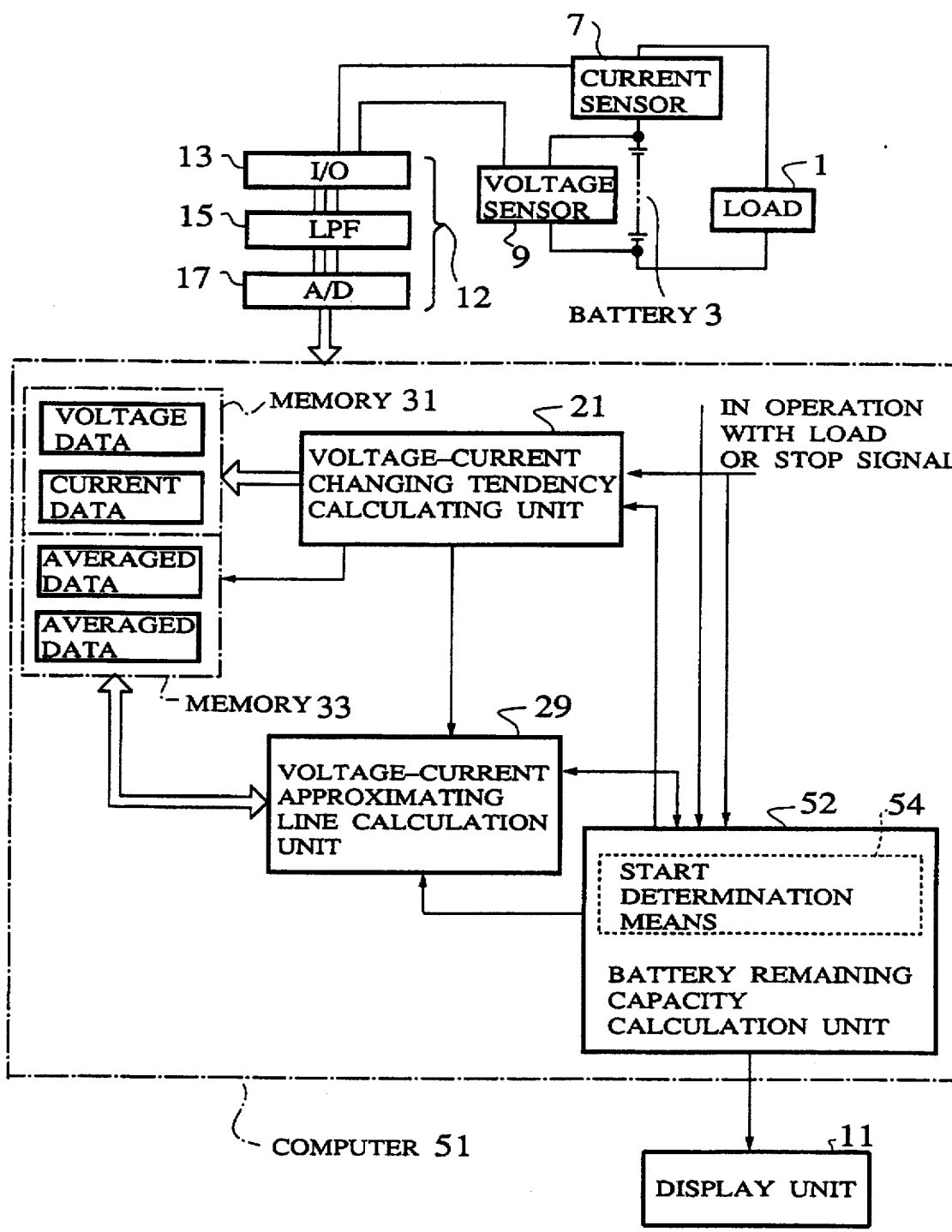
FIG. 10 is a block diagram schematically showing the arrangement of the embodiment 3.

FIG. 10 is a block diagram schematically showing the arrangement of an embodiment 3. In FIG. 10, a reference numeral 1 to 33 denote the same components as those shown in FIG. 3. A reference numeral 52 denotes a battery remaining capacity calculation unit. The battery remaining capacity calculation unit 52 includes a start determination means 54. When a load operation signal is received, the battery remaining capacity calculation unit 52 operates a voltage-current changing tendency calculation unit 21 and a voltage-current approximating line calculation unit 29, specifies a voltage by determining an approximating linear function in the same way as the above and determines a remaining capacity based on the voltage.

Further, when a load is not in operation, the battery remaining capacity calculation unit stops the voltage-current changing tendency calculation unit 21 and the voltage-current approximating line calculation unit 29 and determined and display a remaining capacity of a battery based on a detected voltage and current. Further, the load operation signal is produced when the load varies in an amount equal to or greater than a predetermined amount and a load operation stop state means a state that a load varies in an amount less than the predetermined amount (however, when the device is turned on).

Figure 11A:
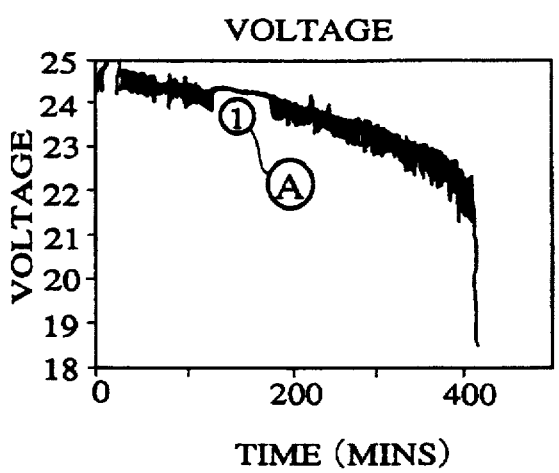
FIGS. 11A-11C are graphs for use in describing a correlation between a voltage and current when a load varies in a very small amount.
Figure 11B:
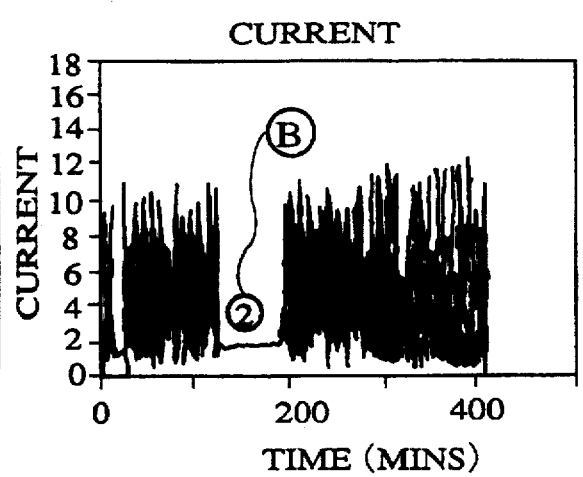
Figure 11C:
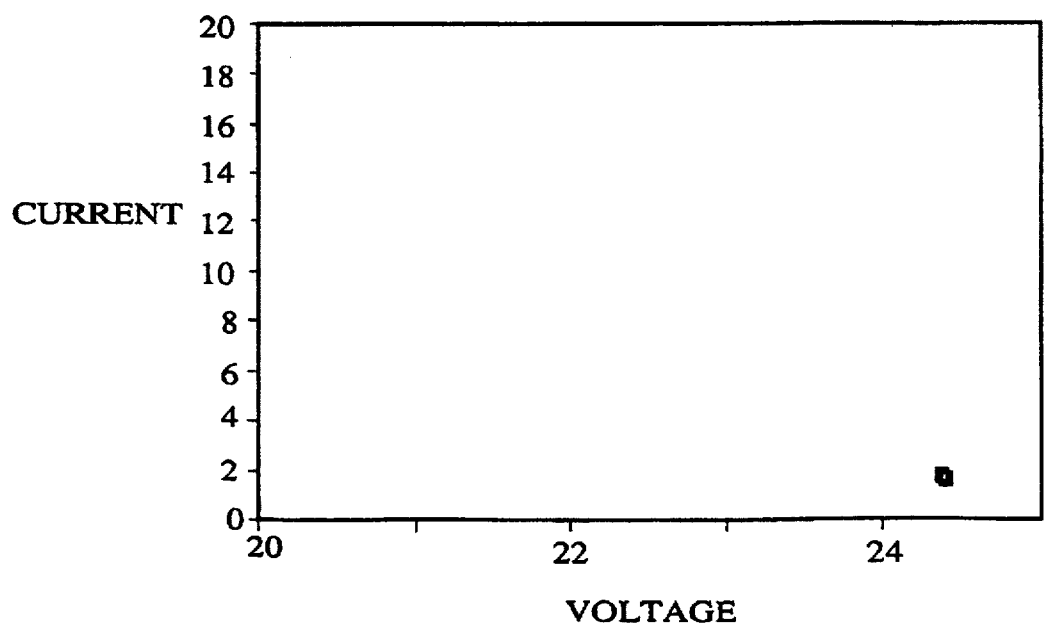

The start determination means 54 is provided because of the reason mentioned below. A highly accurate voltage-current approximating line can be determined from the voltage-current approximating linear function only when voltages and currents are dispersed in a certain degree. However, when, for example, an electromobile stops (with its ignition key turned on), since there is almost no variation of a load, a voltage and current of the battery 3 are not changed as shown in FIG. 11A and 11B. Thus, V-I characteristics are not almost dispersed as shown in FIG. 11C.

Therefore, the start determination means 54 is used to stop the voltage-current changing tendency calculation unit 21 and the voltage-current approximating line calculation unit 29.

Figure 12:
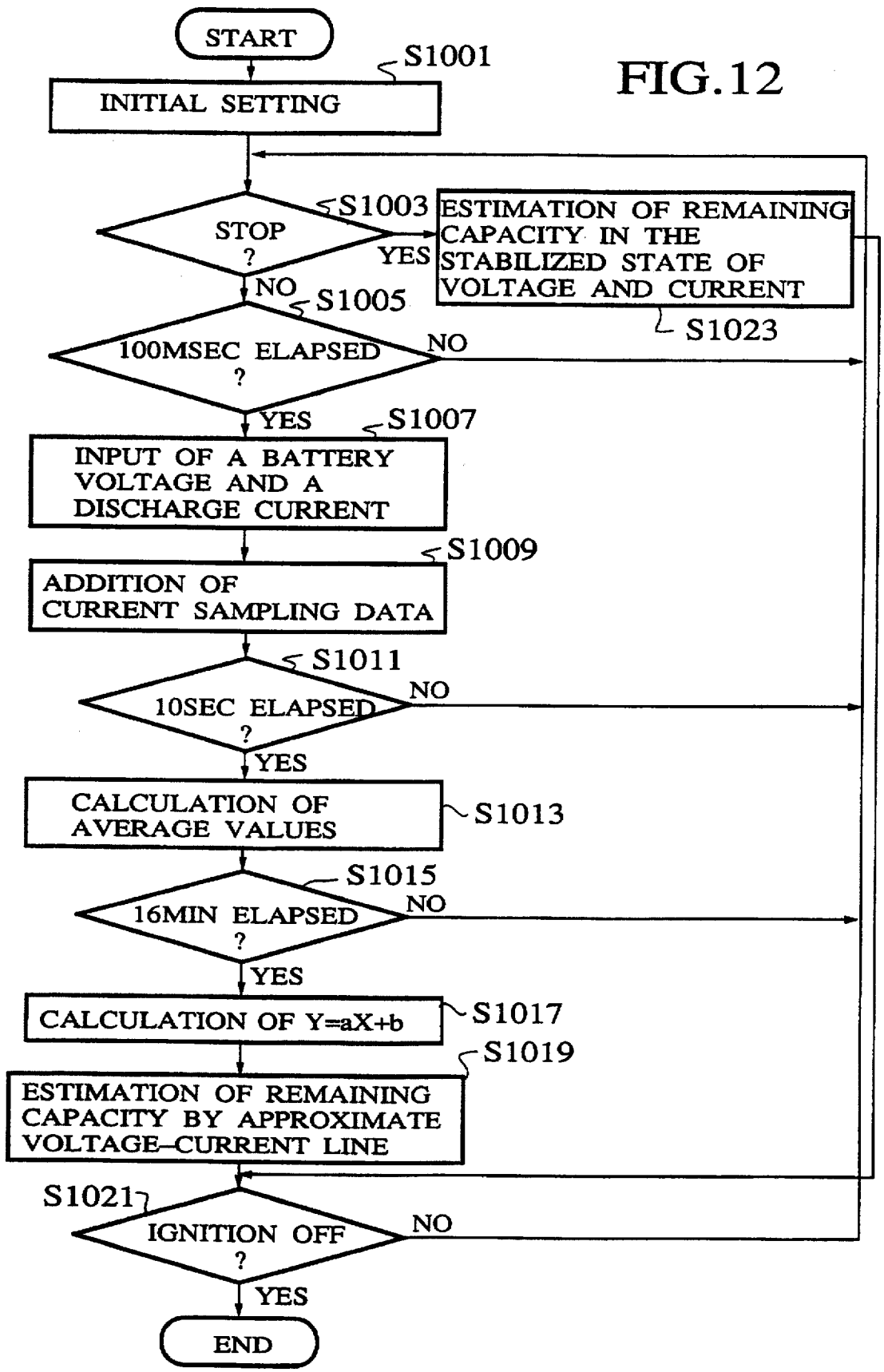
FIG. 12 is a flowchart for use in describing operation of the embodiment 3.

Next, operation will be described. FIG. 12 is a flowchart for use in describing operation of the embodiment 3. Although the battery remaining capacity calculation unit of the embodiment 3 may be arranged similarly to that of the embodiment 2 which calculates a remaining capacity based on a battery temperature and a voltage value, this embodiment will be described as employing the remaining capacity calculation unit of the embodiment 1.

As shown in FIG. 12, processings carried out at steps S1001 to S1021 are similar to those carried out at steps S201 to S221 of FIG. 4. That is, the voltage-current averaging means 25, the average number determination means 27 and the voltage-current approximating line calculation unit 29 of the voltage-current changing tendency calculation unit 21 read a terminal voltage of the battery 3 from a voltage sensor 9 and a current flowing through a load from a current sensor 7, respectively each 100 milliseconds; add the read voltages and currents and average them until 10 seconds elapse; obtain 100 pieces of the averaged voltages and currents to thereby obtain dispersed data of the voltages and currents; determine a voltage-current approximating linear function based on the dispersed data; specify a terminal voltage X of the battery 3 from the voltage-current approximating linear function and a reference discharge current; and obtain a remaining capacity (steps S1001–S1021).

When the start determination means 52 determines that the electromobile stops at step S1003, that is, when a load operation stop signal is produced, the start determination means 52 stops the voltage-current changing tendency calculation unit 21 and the voltage-current approximating line calculation unit 29, and the battery remaining capacity calculation unit 52 samples currents and voltages from a detected value input circuit unit 12 and determines and display a remaining capacity based on the values of them (S1023). Consequently, an accurate remaining capacity can be obtained at all times even if terminal voltages of the battery and currents discharged therefrom are greatly varied as well as when they are stabilized on the contrary.

Embodiment 4

Figure 13:
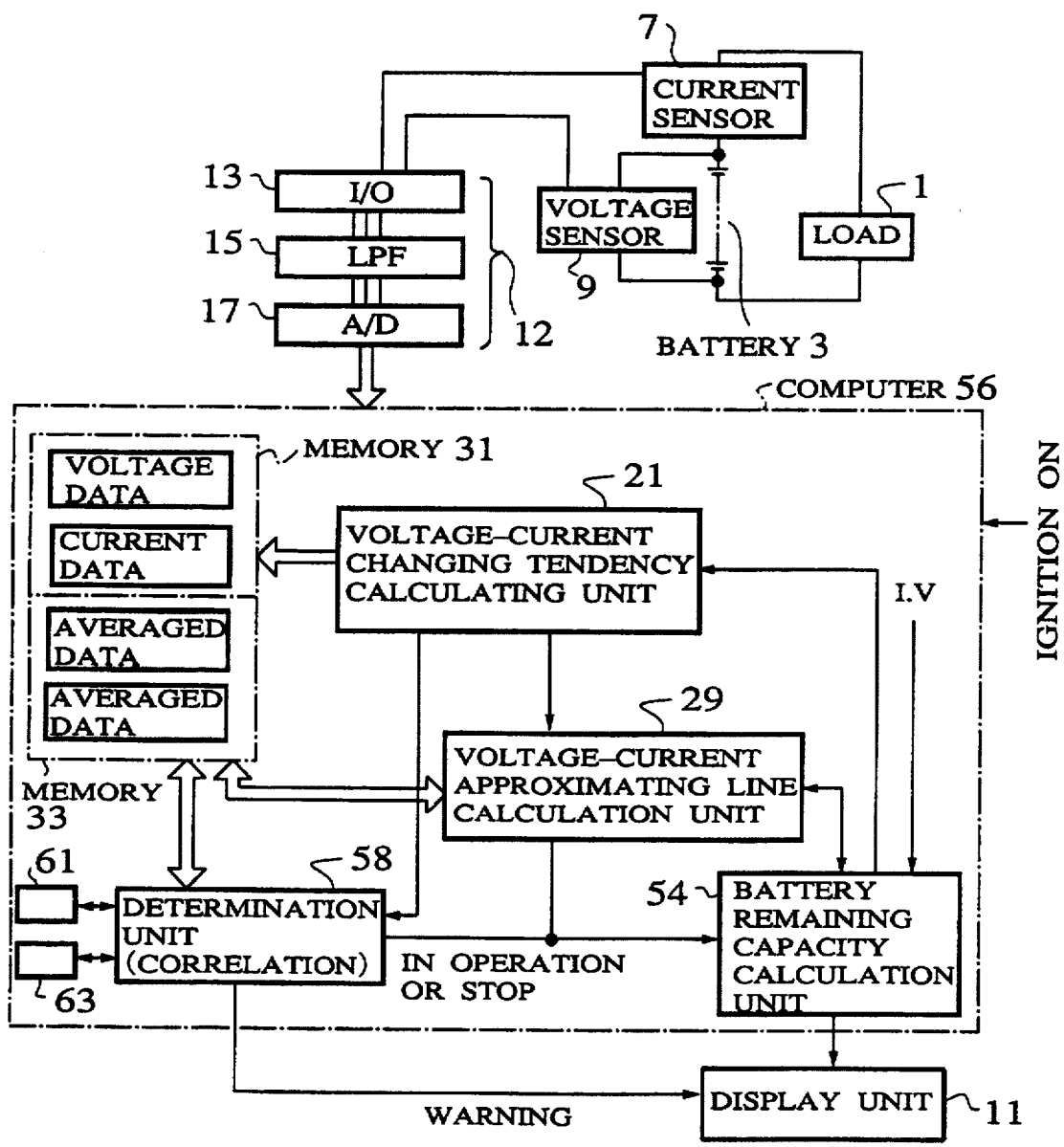
FIG. 13 is a block diagram schematically showing the arrangement of an embodiment 4.
Figure 15:
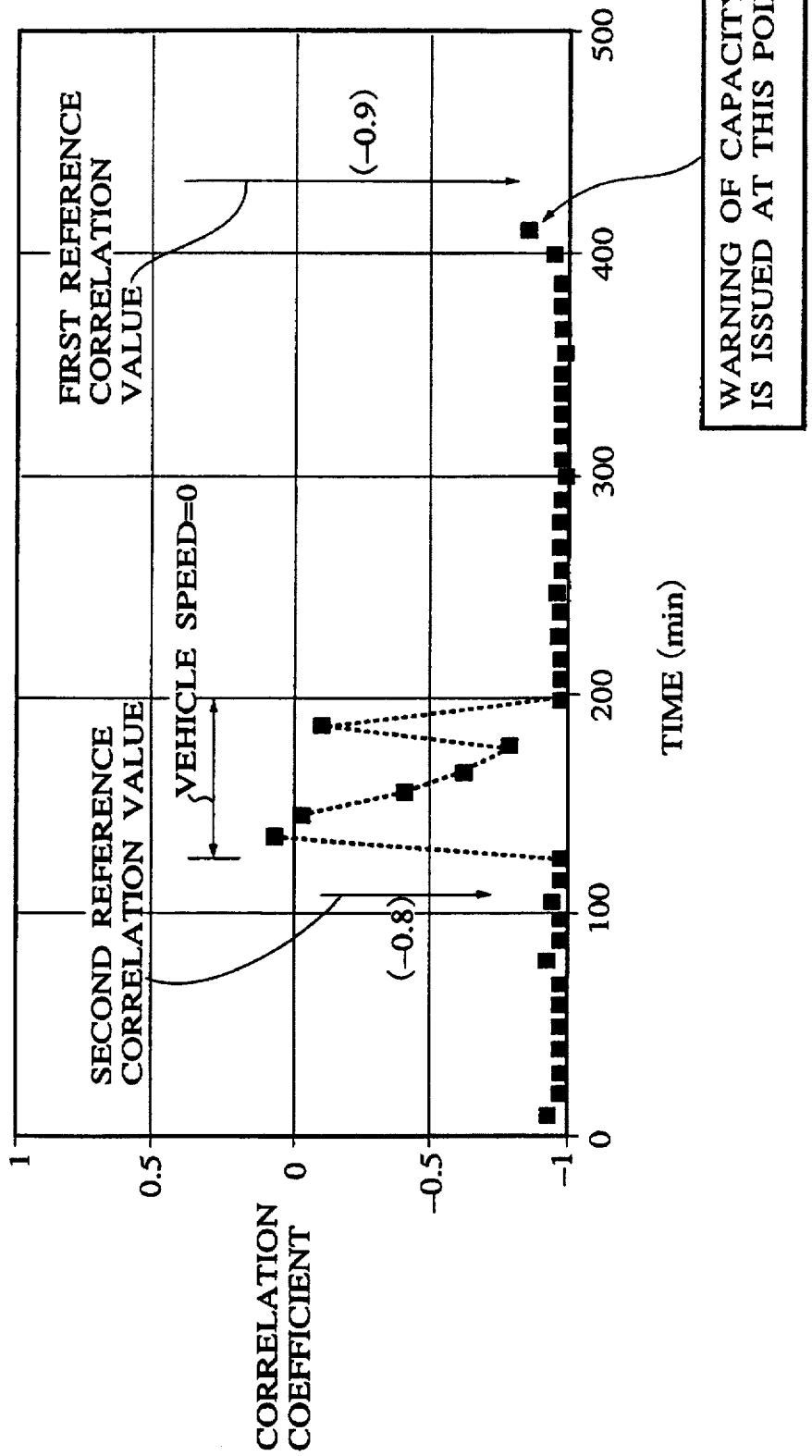
FIG. 15 is a graph for use in describing the determination of a correlation coefficient of the embodiment 3.

FIG. 13 is a block diagram schematically showing the arrangement of an embodiment 4. In FIG. 13, components 1–54 are the same as the above. A computer 56 is composed of a voltage-current changing tendency calculation unit 21, a voltage-current approximating line calculation unit 29, a battery remaining capacity calculation unit 54 and a determination unit 58. The determination unit 58 is started in response to a third output signal; determines a correlation coefficient from the dispersed data of detected voltages and currents stored in a memory 33; determines whether a load varies in an amount equal to or greater than a predetermined amount or less than the predetermined amount based on the correlation coefficient; a first reference negative correlation coefficient 61 and a second reference negative correlation coefficient 63, and produces the result of determination to the battery remaining capacity calculation unit 54. When the determined correlation coefficient is located between both the reference negative correlation coefficients 61, 63, the determination unit 58 produces a signal indicating that a remaining capacity of the battery 3 is equal to or less than a predetermined amount to a display unit 11. As shown in FIG. 15, the first reference negative correlation coefficient 61 is set to, for example, –0.9 and the second reference negative correlation coefficient 63 is set to, for example, –0.8.

As apparent from the reference negative correlation coefficients 61, 63 shown in FIG. 15, when a load varies in a certain degree, batteries exhibit a negative correlation, and as a time elapses, a correlative distribution between voltages and currents is achieved as shown in FIG. 15. Thus, the first reference negative correlation coefficient 61 is set to a value near to a strong negative correlation (e.g., –0.9), and, when a load varies in a small amount, the correlation coefficient becomes a value near to a weak negative correlation (e.g., –0.8). That is, a relationship of first reference negative correlation coefficient 61>the second reference negative correlation coefficient 63 is established between both the reference correlation coefficients 61, 63.

Figure 14:
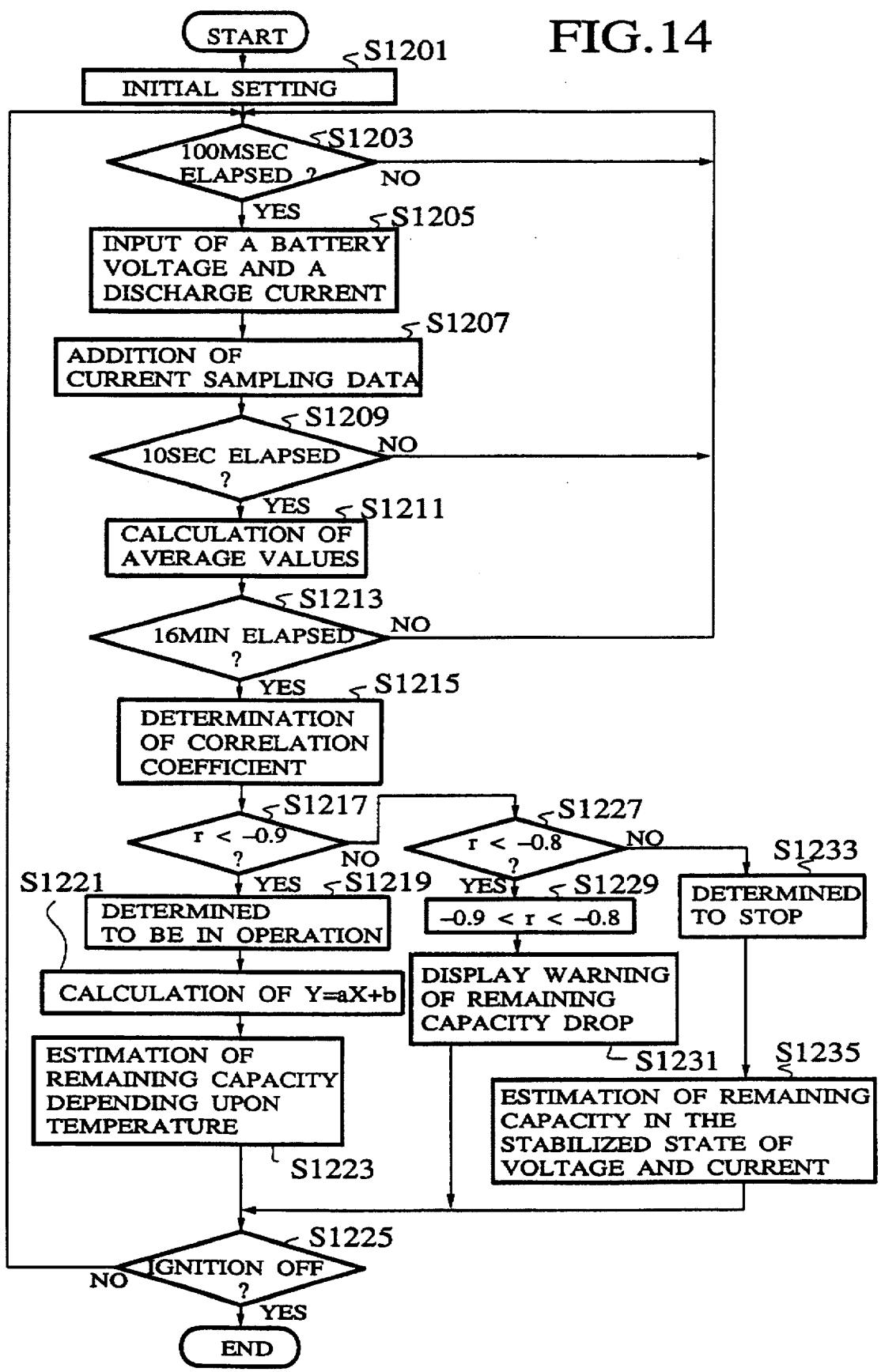
FIG. 14 is a flowchart for use in describing operation of the embodiment 4.

Next, operation will be described. FIG. 14 is a flowchart showing operation of the embodiment 4. As shown in FIG. 14, processings carried out at steps S1201 to S1213 are similar to those carried out at steps S201 to S215 of FIG. 4. That is, the voltage-current averaging means 25 and the average number determination means 27 of the voltage-current changing tendency calculation unit 21 read a terminal voltage of the battery 3 from a voltage sensor 9 and a current flowing through a load from a current sensor 7, respectively each 100 milliseconds; add the read voltages and currents and average them until 10 seconds elapse; obtain 100 pieces of the averaged voltages and currents to thereby create a dispersion table representing the dispersion of voltages and currents. Then, a third output signal is produced to the determination unit 58 so as to start it (S1201 to S1213).

Next, the determination unit 58 determines a correlation coefficient from the dispersed data of voltages and currents stored in a memory 33.

The correlation coefficient $\bar{r}$ is determined as described below. That is, a correlation coefficient calculation unit reads each 100 pieces of average voltage values and current values during 10 seconds from the memory 33 and the correlation coefficient $\bar{r}$ is determined based on the following expression (step 1215).

A method of obtaining the correlation coefficient $\bar{r}$:

$$\bar{r} = \frac{S(XY)}{S(XX)S(YY)} \quad (6)$$

where,

S(XX) is a sum of square of voltage data for t3(min);

S(YY) is a sum of square of current data for t3(min); and

S(XY) is a product sum of voltage and current data.

Further, the following expressions are obtained.

$$S(XX) = E(Xi-X)^2 = EXi^2 - (EXi)^2/n$$

$$S(YY) = E(Yi-Y)^2 = EYi^2 - (EYi)^2/n$$

$$S(XY) = E(Xi-X)(Yi-Y) = EXiYi - (EXi)(EYi)/n$$

where,

Xi: voltage data;

Yi: current data;

X: average value of voltage data

Y: average value of current data

Next, whether the correlation coefficient $\bar{r}$ is equal to or less than –0.9 is determined (step S1217). When it is determined that the correlation coefficient $\bar{r}$ is equal to or less than –0.9, it is determined that the vehicle is in operation (step S1219), so that the voltage-current approximating line calculation unit 29 is started to determine a current-voltage approximating linear function by a method of least squares (step S1221).

Next, it is notified to the battery remaining capacity calculation unit 54 that the vehicle is in operation and the battery remaining capacity calculation unit 54 is caused to calculate a battery remaining capacity by the current-voltage approximating linear function as described above (step S1223). Then, the computer 56 determines whether the ignition key is turned off or not (step S1225), and when it is not turned off, the control is moved to step S1203 to carry out the above operation.

Further, when the correlation coefficient $\bar{r}$ determined at step S1217 is greater than −0.9 and it is, for example, −0.85, it is determined whether the correlation coefficient $\bar{r}$ is equal to or less than −0.8 (step 1227).

When the correlation coefficient $\bar{r}$ is equal to or less than −0.8, it is determined that the correlation coefficient $\bar{r}$ is located between −0.9 and −0.8 (step S1229), warning that a remaining capacity drops is displayed on the display unit 11 and the control is moved to step S1225 (step 1231).

When it is determined that the correlation coefficient $\bar{r}$ determined at step S1227 is greater than −0.8 and it is, for example, −0.7, it is determined that the vehicle stops (step S1233), so that the voltage-current approximating line calculation unit 29 is stopped and it is notified to the battery remaining capacity calculation unit 54 that the vehicle stops.

Then, the battery remaining capacity calculation unit 54 is caused to calculate a remaining capacity in a state that voltages and currents are stabilized. (step S1235).

More specifically, according to the embodiment 4, when the ignition key is operated, a correlation coefficient is determined as a time elapses, it is determined that the vehicle stops when the correlation coefficient has a value near to no correlation and issues not warning, whereas when the correlation coefficient is equal to or more than the statistically determined first reference correlation value 61, warning of capacity drop of the battery is issued on the display 11, as shown in FIG. 15.

Therefore, even if a temperature sensor is not employed as well as even if it is not detected whether an amount of operation of an accelerator, an amount of a speed pulse, an amount of rotation of a wiper, and an amount of a discharged current are equal to or greater than predetermined values, a drop of a remaining capacity of the battery can be accurately detected and the drop can be determined without the need of a map and the like of discharge characteristics for determining the drop of the remaining capacity stored in a ROM.

Since the drop of a remaining capacity of the battery can be simply and accurately detected without the use of such a map, even if the battery is replaced or a different load is used for measurement, the content of the ROM need not be changed.

The determination unit of the embodiment 4 may be provided with the battery remaining capacity measuring device of the embodiment 1, 2 or 3.

Note, although the above embodiments are explained as a battery remaining capacity measuring device for measuring a remaining capacity of a battery used in the electromobile, the battery remaining capacity measuring device of the present invention may be applied to portable telephones and the like.

In the above respective embodiments, although the voltage-current approximating line is determined by averaging voltages and currents, it may be determined by substituting voltages and currents for a predetermined expression of a linear line and effecting addition, multiplication, division and the like.

Further, the data collecting time is set to 16 minutes in the above embodiments, it may be set longer or shorter depending upon a device to be mounted.

As described above, according to the present invention, each time a certain period of time elapses, dispersed data of detected voltages and currents is obtained, a voltage-current approximating linear function is determined based on the dispersed data for a period during which the predetermined number of detected voltages and currents are collected, and a remaining capacity is determined based on voltage-current characteristics obtained from the determined voltage-current approximating linear function. Thus, the approximating line determined when a vehicle is in the operation is an approximating linear function which sufficiently takes the variation of voltages and currents into consideration as well as a voltage value specified each time the approximating line is determined is a value representing a terminal voltage in a certain reference discharge current, whereby there can be obtained an advantage that a voltage of high accuracy can be determined even if no correlation exists in the ratio of change of detected voltages and currents.

Each time a certain period of time elapses, detected voltages and currents are sampled, each time the sampled voltages and currents amount to the certain number, they are averaged, and each time the predetermined number of the averaged voltages and currents are collected, they are produced as dispersed data so as to determine a voltage-current approximating linear function. Thus, there can be obtained an advantage that as a load is more greatly varied, a voltage-current approximating linear function remarkably expressing the characteristics of change of voltages and currents can be obtained.

Since an approximating line in which the errors of voltages and currents are minimized by a method of least squares is determined by the voltage-current characteristics calculation unit each time dispersed data is produced, there can be obtained an advantage that the determined line has a small amount of error even if a load is abruptly varied.

Each time a voltage-current approximating linear function is determined, a voltage value corresponding to a predetermined discharge current is calculated from the voltage-current approximating linear function and the voltage value is displayed as a remaining capacity of a battery. Thus, there can be obtained an advantage that a drop of a remaining capacity can be found by observing a change of the displayed voltage.

Each time a voltage-current approximating linear function is determined, a remaining capacity is determined based on the voltage-current characteristics obtained from the voltage-current approximating line and a data table or function showing a remaining capacity corresponding to pre-stored voltage-current characteristics. Thus, there can be obtained an advantage that calculation can be simplified because the remaining capacity need not be determined taking a temperature and the like into consideration.

When a temperature sensor for detecting a temperature of a battery is provided in addition of a voltage sensor and current sensor, each time a voltage-current approximating linear function is determined, a voltage value corresponding to a given discharge current value predetermined from the voltage-current approximating linear function is determined and a remaining capacity is determined based on the voltage value, a temperature of the temperature sensor and a pre-stored voltage-temperature-remaining capacity data table or function corresponding to a predetermined discharge current. Thus, there can be obtained an advantage that calculation can be simplified even if the temperature sensor is employed.

When a load is varied in an amount equal to or less than a predetermined amount, a remaining capacity is not determined by an approximating linear function but determined based on voltages detected from a voltage sensor and currents detected a current sensor. Thus, there can be obtained an advantage that the remaining capacity can be accurately determined regardless of that how a load varies.

A correlation coefficient between detected voltages and detected currents is determined based on dispersed data, it is determined based on the correlation coefficient whether a load varies in an amount equal to or less than a predetermined amount or greater than it, and a remaining capacity is determined by an approximating linear function based on the result of determination or determined based on voltages and currents detected from a voltage sensor and current sensor. Thus, there can be obtained an advantage that a program need not be provided which determines whether a load changes or not by an amount of operation of an accelerator, an amount of a speed pulse, and the like.

Further, whether a remaining capacity drops or not is determined based on a value of a correlation coefficient, and when the remaining capacity drops, it is notified to a driver using a display unit, so that a drop of the remaining capacity can be determined without the need of a map or the like of discharge characteristics and the like stored to a ROM. Thus, there can be obtained an advantage that even if a battery is replaced or a different load is used for measurement, the content of the ROM need not be changed.

It should be understood that many modifications and adaptations of the invention will become apparent to those skilled in the art and it is intended to encompass such obvious modifications and change in the scope of the claims appended hereto.

What is claimed is:

1. A battery remaining capacity measuring device, comprising:

voltage detecting means for detecting values of voltage at a battery terminal connected to a load;

current detecting means for detecting values of current flowing through the load;

voltage-current changing tendency calculation means for reading values of voltage detected by said voltage detecting means and values of current detected by said current detecting means, for storing the values of voltage and current as plural voltage data and corresponding plural current data, respectively, and for outputting plural voltage data and the corresponding plural current data;

determination means for calculating a correlation coefficient between the plural voltage data and the corresponding plural current data, for determining that variation of the load is equal to or less than a predetermined amount when the correlation coefficient exhibits a negative correlation and is equal to or greater than a first reference negative correlation coefficient, and for determining that variation of the load is greater than the predetermined amount when the correlation coefficient is equal to or less than a second reference negative correlation coefficient which is less than the first reference negative correlation coefficient;

voltage-current approximating linear calculation means for receiving the plural voltage data and the corresponding plural current data and determining a voltage-current approximating linear function from the plural voltage data and corresponding plural current data; and battery remaining capacity calculation means for determining a remaining capacity of the battery by directly receiving values of voltage detected by said voltage detecting means and values of current detected by said current detecting means when the variation of the load is equal to or less than the predetermined amount, and determining the remaining capacity based on the voltage-current approximating linear function from the plural voltage data and the corresponding plural current data.

2. A battery remaining capacity measuring device according to claim 1, wherein said battery remaining capacity calculation means calculates a voltage value corresponding to a given discharge current according to the voltage-current approximating linear function and converts the voltage value into the remaining capacity of the battery.

3. A battery remaining capacity measuring device according to claim 1, wherein when the correlation coefficient is located between the first reference negative correlation coefficient and the second reference negative correlation coefficient, said determination means determines that the remaining capacity of the battery drops below a predetermined amount.

* * * * *